(12) United States Patent
Gowda et al.

(10) Patent No.: US 9,806,051 B2
(45) Date of Patent: Oct. 31, 2017

(54) ULTRA-THIN EMBEDDED SEMICONDUCTOR DEVICE PACKAGE AND METHOD OF MANUFACTURING THEREOF

(71) Applicant: General Electric Company, Schenectady, NY (US)

(72) Inventors: Arun Virupaksha Gowda, Rexford, NY (US); Paul Alan McConnelee, Albany, NY (US); Shakti Singh Chauhan, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 27 days.

(21) Appl. No.: 14/195,930

(22) Filed: Mar. 4, 2014

(65) Prior Publication Data

US 2015/0255418 A1 Sep. 10, 2015

(51) Int. Cl.
*H01L 23/02* (2006.01)
*H01L 23/00* (2006.01)
(Continued)

(52) U.S. Cl.
CPC .............. *H01L 24/32* (2013.01); *H01L 23/34* (2013.01); *H01L 23/367* (2013.01);
(Continued)

(58) Field of Classification Search
CPC ......... H01L 23/18; H01L 23/24; H01L 23/31; H01L 23/3107; H01L 23/522;
(Continued)

(56) References Cited

U.S. PATENT DOCUMENTS 5,048,179 A 9/1991 Shindo et al.
5,567,657 A 10/1996 Wojnarowski et al.
(Continued)

FOREIGN PATENT DOCUMENTS

CN 103137613 A 6/2013
FR 2572849 A1 5/1986

OTHER PUBLICATIONS

The European Search Report and Opinion issued in connection with corresponding EP Application No. 15157300.3 dated Sep. 8, 2016.
(Continued)

*Primary Examiner* — Kenneth Parker
*Assistant Examiner* — Tuan A Hoang
(74) *Attorney, Agent, or Firm* — Ziolkowski Patent Solutions Group, SC (57) ABSTRACT

A package structure includes a first dielectric layer, semiconductor device(s) attached to the first dielectric layer, and an embedding material applied to the first dielectric layer so as to embed the semiconductor device therein, the embedding material comprising one or more additional dielectric layers. Vias are formed through the first dielectric layer to the at least one semiconductor device, with metal interconnects formed in the vias to form electrical interconnections to the semiconductor device. Input/output (I/O) connections are located on one end of the package structure on one or more outward facing surfaces thereof to provide a second level connection to an external circuit. The package structure interfits with a connector on the external circuit to mount the package perpendicular to the external circuit, with the I/O connections being electrically connected to the connector to form the second level connection to the external circuit.

17 Claims, 8 Drawing Sheets

(51) Int. Cl.
| | |
|---|---|
| *H01L 23/34* | (2006.01) |
| *H01L 23/538* | (2006.01) |
| *H05K 3/30* | (2006.01) |
| *H05K 3/46* | (2006.01) |
| *H01L 23/367* | (2006.01) |
| *H01L 23/373* | (2006.01) |
| *H01L 23/48* | (2006.01) |
| *H01L 25/10* | (2006.01) |
| *H01L 23/42* | (2006.01) |
| *H01L 23/433* | (2006.01) |
| *H05K 1/18* | (2006.01) |
| *H05K 1/02* | (2006.01) |
| *H05K 3/36* | (2006.01) |

(52) U.S. Cl.
CPC .......... *H01L 23/373* (2013.01); *H01L 23/481* (2013.01); *H01L 23/5389* (2013.01); *H01L 24/19* (2013.01); *H01L 24/24* (2013.01); *H01L 24/25* (2013.01); *H01L 24/27* (2013.01); *H01L 24/43* (2013.01); *H01L 24/46* (2013.01); *H01L 24/82* (2013.01); *H01L 24/83* (2013.01); *H01L 25/105* (2013.01); *H05K 3/305* (2013.01); *H05K 3/4602* (2013.01); *H01L 23/42* (2013.01); *H01L 23/433* (2013.01); *H01L 24/45* (2013.01); *H01L 2224/04105* (2013.01); *H01L 2224/05599* (2013.01); *H01L 2224/2402* (2013.01); *H01L 2224/24137* (2013.01); *H01L 2224/24195* (2013.01); *H01L 2224/2518* (2013.01); *H01L 2224/2711* (2013.01); *H01L 2224/2919* (2013.01); *H01L 2224/32225* (2013.01); *H01L 2224/32501* (2013.01); *H01L 2224/43* (2013.01); *H01L 2224/45147* (2013.01); *H01L 2224/46* (2013.01); *H01L 2224/80365* (2013.01); *H01L 2224/85399* (2013.01); *H01L 2224/92144* (2013.01); *H01L 2225/1052* (2013.01); *H01L 2225/1094* (2013.01); *H01L 2924/00014* (2013.01); *H01L 2924/1033* (2013.01); *H01L 2924/1203* (2013.01); *H01L 2924/1304* (2013.01); *H01L 2924/13091* (2013.01); *H01L 2924/1433* (2013.01); *H05K 1/0206* (2013.01); *H05K 1/0209* (2013.01); *H05K 1/183* (2013.01); *H05K 1/185* (2013.01); *H05K 3/301* (2013.01); *H05K 3/306* (2013.01); *H05K 3/366* (2013.01); *H05K 2201/0195* (2013.01); *H05K 2201/09845* (2013.01); *H05K 2203/302* (2013.01); *Y02P 70/613* (2015.11)

(58) Field of Classification Search
CPC ............. H01L 23/5221; H01L 23/5226; H01L 23/528–23/5286; H01L 23/538–23/5386; H01L 21/52; H01L 21/56; H01L 25/112; H01L 25/115; H01L 25/04; H01L 25/0652; H01L 25/0655; H01L 25/07; H01L 25/071; H01L 25/072; H01L 23/49586; H01L 23/293; H01L 23/3192; H01L 23/49575
USPC .................................................. 257/712–722
See application file for complete search history.

(56) References Cited

U.S. PATENT DOCUMENTS

| | | | |
|---|---|---|---|
| 5,703,400 A | 12/1997 | Wojnarowski et al. | |
| 6,232,659 B1* | 5/2001 | Clayton | 257/724 |
| 6,306,680 B1 | 10/2001 | Fillion et al. | |
| 6,377,461 B1* | 4/2002 | Ozmat | H01L 23/3677 165/80.3 |
| 6,930,385 B2 | 8/2005 | Hsu et al. | |
| 7,183,496 B2* | 2/2007 | Arrigotti et al. | 174/260 |
| 7,839,642 B2* | 11/2010 | Martin | H02B 1/56 361/611 |
| 8,040,682 B2* | 10/2011 | Shimoda | H01L 23/36 257/678 |
| 8,114,712 B1 | 2/2012 | McConnelee et al. | |
| 8,240,032 B2* | 8/2012 | Iihola | H05K 1/188 29/832 |
| 8,240,033 B2* | 8/2012 | Tuominen | H01L 23/5389 174/260 |
| 8,310,040 B2 | 11/2012 | Beaupre et al. | |
| 8,334,593 B2* | 12/2012 | McConnelee | H01L 21/486 257/678 |
| 8,653,635 B2* | 2/2014 | Gowda et al. | 257/666 |
| 2005/0051889 A1* | 3/2005 | Wood | H01L 23/49805 257/712 |
| 2008/0190748 A1* | 8/2008 | Arthur | H01H 59/0009 200/181 |
| 2010/0230800 A1 | 9/2010 | Beaupre et al. | |
| 2011/0069448 A1 | 3/2011 | Weichslberger et al. | |
| 2011/0244636 A1* | 10/2011 | Kondo | H01L 23/49822 438/127 |
| 2011/0266665 A1 | 11/2011 | Gowda et al. | |
| 2012/0161325 A1 | 6/2012 | McConnelee et al. | |
| 2012/0320545 A1 | 12/2012 | Lo Presti et al. | |
| 2013/0256858 A1* | 10/2013 | Komposch | H01L 23/047 257/676 |

OTHER PUBLICATIONS

Fisher et al., "High Frequency, Low Cost, Power Packaging Using Thin Film Power Overlay Technology", Applied Power Electronics Conference and Exposition, 1995. APEC '95. Conference Proceedings 1995., Tenth Annual , Issue Date : Mar. 5-9, 1995,pp. 12-17 , vol. 1.

European Search Report and Opinion issued in connection with corresponding EP Application No. 15157300.3 dated May 23, 2016.

* cited by examiner

ULTRA-THIN EMBEDDED SEMICONDUCTOR DEVICE PACKAGE AND METHOD OF MANUFACTURING THEREOF

BACKGROUND OF THE INVENTION

Embodiments of the invention relate generally to structures and methods for packaging semiconductor devices and, more particularly, to an ultra-thin power device packaging structure having power overlay (POL) interconnects that form all electrical and thermal interconnections in the structure, with the packaging structure having reduced inductance.

Power semiconductor devices are semiconductor devices used as switches or rectifiers in power electronic circuits, such as switched mode power supplies, for example. In use, power semiconductor devices are typically surface mounted to an external circuit by way of a packaging structure, with the packaging structure providing an electrical connection to the external circuit and also providing a way to remove the heat generated by the devices and protect the devices from the external environment. Alternatively, especially for higher power ranges, the power modules packaging structures may have large terminals for connection to the external circuit which add significant inductance and increase the size of the module.

Most existing power device packaging structures use wirebonds, a multi-layer substrate (e.g., a direct bond copper (DBC) substrate), and are leaded (leadframe, etc.) or provided with bolted terminals for providing electrical and thermal connectivity to the packaging structure. The wirebonds make the connections from one surface of the packaging structure to package pins, which then interface to the external circuit, with a DBC being connected to the other surface of the packaging structure (e.g., soldered thereto). It is recognized, however, that the DBC adds significant cost to the packaging structure both from a materials standpoint and from a processing standpoint—as additional processing steps and temperature excursions are required when including a DBC in the packaging structure, such as soldering and flux cleaning processes required for joining the DBC to the packaging structure. It is also recognized that the wirebonds and leads add significant parasitic inductance that reduces the efficiency of the package. Wirebonds also add significant height to the package. It is still further recognized that—while the leads on the packaging structure allow higher thermal cycling reliability and are not subject to stringent Moisture Sensitivity Level (MSL) Requirements—the leads or terminals in a power module can be quite large and affect the module foot-print and thickness on the PCB and also negatively impact the electrical performance due to high inductance.

Therefore, it would be desirable to provide a semiconductor device package structure that eliminates the need for a multi-layer DBC or PCB substrate and wirebond connections, so as to provide a very thin package structure with ultra low inductance. It would further be desirable for such a package structure to have a high device density and a small foot-print, so as to enable system miniaturization to improve electrical and reliability performance of the package.

BRIEF DESCRIPTION OF THE INVENTION

In accordance with one aspect of the invention, a package structure includes a first dielectric layer, at least one semiconductor device attached to the first dielectric layer, and an embedding material applied to the first dielectric layer so as to embed the at least one semiconductor device therein, the embedding material comprising one or more additional dielectric layers. The package structure also includes a plurality of vias formed in the first dielectric layer formed to the at least one semiconductor device, metal interconnects formed in the plurality of vias and on one or more outward facing surface of the package structure to form electrical interconnections to the at least one semiconductor device, and input/output (I/O) connections located on one end of the package structure on one or more outward facing surfaces thereof to provide a second level connection to an external circuit. The package structure is configured to interfit with a connector formed on the external circuit to mount the package perpendicular to the external circuit, with the I/O connections on the one end of the package structure being electrically connected to the connector to form the second level connection to the external circuit.

In accordance with another aspect of the invention, a method of manufacturing a semiconductor device package structure includes attaching at least one semiconductor device to a first dielectric layer by way of an adhesive, applying an embedding material on the first dielectric layer so as to be positioned about the at least one semiconductor device, and performing a lamination process to cause the embedding material to fill any air gaps present around the at least one semiconductor device and so as to embed the at least one semiconductor device therein, wherein the first dielectric layer does not melt or flow during the lamination process. The method also includes forming a plurality of vias to the at least one semiconductor device, forming metallic interconnects in the plurality of vias and over at least a portion of one or more outer surfaces of the package structure to form electrical interconnections to the at least one semiconductor device, and forming input/output (I/O) connections on one or more of the outward facing surfaces of the package structure, at only one end of the package structure, the I/O connections comprising electrical leads that provide a second level connection to an external circuit.

In accordance with yet another aspect of the invention, a package structure includes a first dielectric layer having an adhesive applied on at least a portion thereof, one or more semiconductor devices attached to the first dielectric layer by way of the adhesive, an embedding material positioned on the first dielectric layer about the one or more semiconductor devices so as to embed the one or more semiconductor devices therein, a plurality of vias formed to the at least one semiconductor device, metal interconnects formed in the plurality of vias to form all electrical and thermal interconnections to the one or more semiconductor devices and in the package structure and input/output (I/O) connections formed on at least one outer surface of the package structure to provide a second level connection to an external circuit, wherein the I/O connections are configured to interfit with a socket or recess formed in the external circuit, such that the package structure is partially embedded in the external circuit when the I/O connections of the package structure are interfit in socket or recess.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for an embedded power module package structure having power overlay (POL) interconnects that form all electrical and thermal interconnections to the semiconductor devices in the power module, as well as a method of forming such a package structure. The package structure is constructed to have an "ultra-thin" construction in two axes, and may be partially embedded in an external circuit (e.g., PCB) to which the package structure is mounted.

Figure 1:
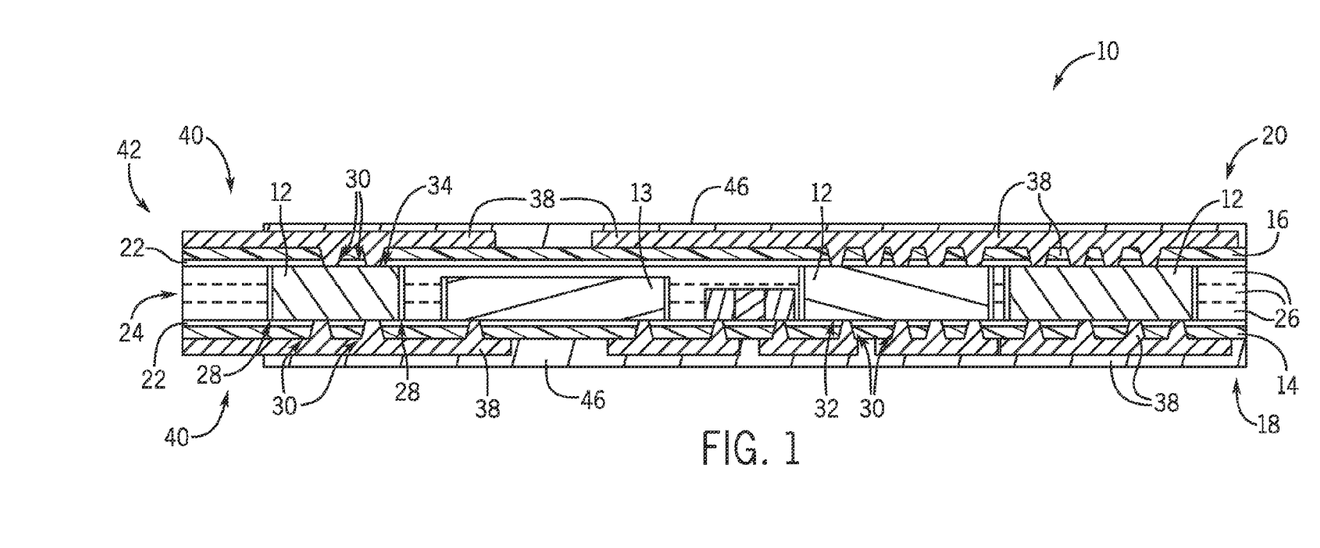
FIG. 1 is a schematic cross-sectional side view of a power overlay (POL) package structure, according to an embodiment of the invention.

Referring to FIG. 1, a POL packaging and interconnect structure 10 is shown according to an embodiment of the invention. The package structure 10 includes one or more semiconductor devices 12, 13 that can be in the form of either what can generally be described as a "power device" or a "non-power device", and thus can be in the form of a die, diode, MOSFET, transistor, application specific integrated circuit (ASIC), or processor, for example. While three power semiconductor devices 12 and a single non-power semiconductor device 13 (i.e., gate driver) are shown in FIG. 1, it is recognized that a lesser or greater number of semiconductor devices or electronic components could be included in the POL structure 10. The semiconductor devices 12, 13 are packaged within package structure 10 such that direct metallic interconnects form all electrical and/or thermal interconnections to the device.

As shown in FIG. 1, according to an exemplary embodiment, the package structure 10 includes a dielectric layer on each of opposing sides of the package structure 10 (with the semiconductor devices 12, 13 positioned therebetween), with the layers being generally referred to as a first dielectric layer 14 and a second dielectric layer 16. While package structure 10 includes both first dielectric layer 14 and a second dielectric layer 16, it is recognized that embodiments of the invention may only include a first dielectric layer 14. In FIG. 1, the dielectric layers 14, 16 are provided in the form of a lamination or film and are formed of a material that is chosen to provide mechanical and temperature stability to vias during use and frame processing, as well as provide suitable dielectric properties and voltage breakdown strength and processability for via formation and POL processing—and thus the dielectric layers 14, 16 can be referred to as a "POL dielectric." Additionally, the material from which dielectric layers 14, 16 is formed is chosen to remain stable during a lamination process performed on the package structure 10. That is, dielectric layers 14, 16 are formed of a suitable material such that they are configured to not flow during a lamination process performed on the package structure 10. Accordingly, the dielectric layers 14, 16 may be formed of one a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material, according to embodiments of the invention. For purposes of clarity and distinguishing of the dielectric layers 14, 16 from other dielectric materials in the package structure 10, the dielectric layers 14, 16 are hereafter referred to as polyimide layers 14, 16, although this term is not meant to limit formation of the layers 14, 16 from a specific dielectric material.

As shown in FIG. 1, polyimide layers 14, 16 are provided on both sides of the package structure 10, i.e., on front and back surfaces 18, 20 of the package structure, so as to provide the ability to form vias and patterned metal interconnects on both surfaces, as will be explained further below. The semiconductor devices 12, 13 are positioned between the polyimide layers 14, 16, with the devices 12, 13 being attached to the polyimide layers 14, 16 by way of an adhesive 22. According to embodiments of the invention, an embedding material 24 (i.e., encapsulant) is included in package structure 10 that is provided between the polyimide layers 14, 16 that serves to fill-up empty gaps within the package structure 10 that might be present around the semiconductor devices 12, 13 and between the polyimide layers 14, 16 and, according to one embodiment, may 'glue' the polyimide layer 14 to the devices 12, 13, and thus may be formed of one or more materials.

According to one embodiment of the invention, and as shown in FIG. 1, the embedding material 24 is comprised of one or more dielectric layers 26 that are provided in a 'film' or 'panel' or 'sheet' form, such that, if required, multiple dielectric sheets 26 can be stacked on one another to a required height/thickness required to fill in an area about the semiconductor devices 12, 13 and between the polyimide layers 14, 16. The dielectric sheets 26 are formed from an electrically insulating material, such as a prepreg material, printed circuit board core material, polymeric resin, or other suitable adhesive, for example. According to one embodiment, the electrically insulating dielectric sheets 26 may be provided in a form that is either uncured or partially cured (i.e., B-stage), such that they can be easily stacked in their pre-cure film form. According to another embodiment, the electrically insulating dielectric sheets 26 may be provided as both cured and uncured sheets, such as sheets of a cured core material and sheets of a flowable prepreg material or a mixture of sheets of polyimide and a flowable adhesive (e.g., layer 22). Other insulating materials may also be used such as ceramics or glass. According to one embodiment of the invention, the dielectric sheet(s) 26 include openings/cutouts 28 formed therein to receive the semiconductor devices 12, 13 therein and accommodate positioning of the sheet(s) 26 thereabout. Alternatively, it is recognized that segments of dielectric sheets 26 could be placed about the semiconductor devices 12, 13.

While embedding material 24 is described above as being comprised of one or more dielectric layers 26 that are provided in a 'film' or 'panel' or 'sheet' form, it is recognized that embedding material 24 could include other materials. For example, the dielectric stack that is the embedding material 24 can be comprised of a layer of metal or a dielectric film with thick copper, for example, that does not melt and flow when subjected to a lamination process. In such embodiments, these layers would be electrically isolated as needed from the devices 12, 13, but beneficially could function as a heat-spreading embedded structure that can be connected with vias to spread heat and conduct to the ambient. These embedded layers with metallization can also be patterned and interconnected to provide additional routing layers for added circuit density.

In order to fill-up empty gaps within the package structure 10, the dielectric sheet(s) 26 are subjected to a lamination/curing process (typically in vacuum environment, at elevated temperature and under mechanical pressure) that causes all or some of the dielectric sheet(s) 26 to "melt" and flow. The dielectric sheet(s) 26 thus lose their film form and flow to fill up any empty air gaps around the semiconductor devices 12, 13 and between the polyimide layers 14, 16, such that a dielectric encapsulant 24 is provided that protects the semiconductor devices 12, 13 from the ambient environment in general and provides mechanical integrity and electrical isolation.

Figure 2:
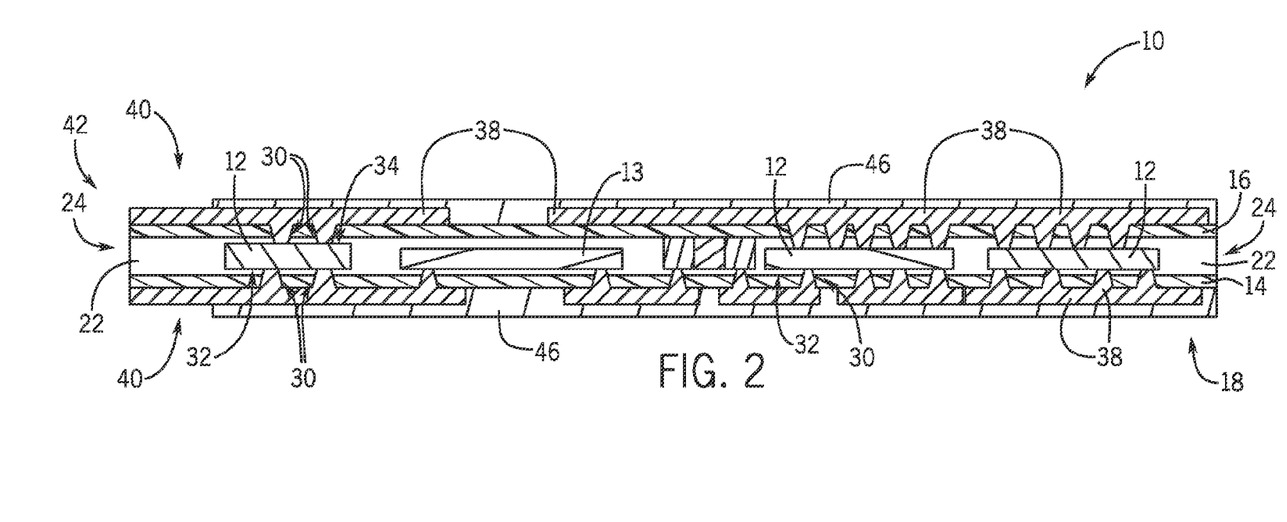
FIG. 2 is a schematic cross-sectional side view of a POL package structure, according to an embodiment of the invention.

Referring now to FIG. 2, an alternate embodiment of package structure 10 is shown in which the embedding material 24 is formed only of adhesive 22. That is, in cases where the semiconductor devices 12, 13 are very thin, no dielectric layers 26 may be required to encapsulate the semiconductor devices. Instead, the adhesive 22 is coated on the surface of the polyimide layer 14, beyond the area in which the semiconductor devices 12, 13 are attached, and during lamination, this adhesive 22 is sufficient to fill the gaps around the semiconductor devices 12, 13 between the polyimide layers 14, 16. While the polyimide layers 14, 16 are shown in FIG. 2 as being parallel to one another, it is recognized that such an arrangement of the polyimide layers 14, 16 is not required, as the gap between the two polyimide layers 14, 16 may be smaller in areas where the die are not present so as to result in an arrangement where the polyimide layers 14, 16 are not parallel.

In each of the embodiments of package structure 10 shown in FIGS. 1 and 2, a plurality of vias 30 is formed through polyimide layer 14 down to a front surface 32 of the semiconductor devices 12, 13. For power semiconductor devices 12, vias 30 may all be formed to front surface 32 of the semiconductor devices 12 (e.g., as for GaN power devices) or may instead be formed to both the front surface and back surface 34 of the semiconductor devices 12, to meet electrical and thermal requirements (e.g., to make electrical connection that is needed and remove heat from the power semiconductor device). Metal interconnects 38 are subsequently formed in the package structure 10 to provide electrical and thermal connections/pathways therein, with the interconnects 38 being formed in the vias 30 and out onto the outward facing front and back surfaces 18, 20 of the polyimide layers 14, 16, respectively, such that both front and back surfaces 18, 20 of the package structure 10 include interconnects formed thereon. According to embodiments of the invention, the metal interconnects 38 comprise "POL interconnects" that are formed as robust electroplated copper interconnects that form direct electrical connections in the devices 12, 13. Depending on the metallization on the device, in some embodiments, a sputtered adhesion layer (titanium, chromium, etc.) is provided along with a sputtered copper seed layer on which copper can be plated. As shown in FIGS. 1 and 2, the metal interconnects 38 are patterned and etched to a desired shape, such as to provide for electrical and thermal connections to package structure 10. According to one embodiment, metal interconnects 38 are patterned and etched to provide a large area thermal and electrical connection on the front and/or back side of package structure 10 (i.e., copper pad) that enables attachment of the package structure to a heatsink, for example, as will be explained in greater detail further below.

While the package structures 10 of FIGS. 1 and 2 are shown as only including dielectric layers 14, 16 having metal interconnects 38 formed therein, it is recognized that a further build-up of the package could be performed. That is, as shown in FIG. 3, one or more additional metal circuit layers 39 (i.e., dielectric layer and patterned metal interconnect) could be applied to each of the front and back surfaces 18, 20 of the package structure to increase routing in the package structure 10.

According to another embodiment, rather than adding additional metal circuit layers to the package structure 10 (as in FIG. 3), routing could be increased in the package structure by adding a metal layer (not shown) on the inward side of dielectric layers 14, 16 (i.e., on the side of the devices 12, 13). In such an embodiment, metal layers would thus be present on both sides of each dielectric layer 14, 16.

Figure 3:
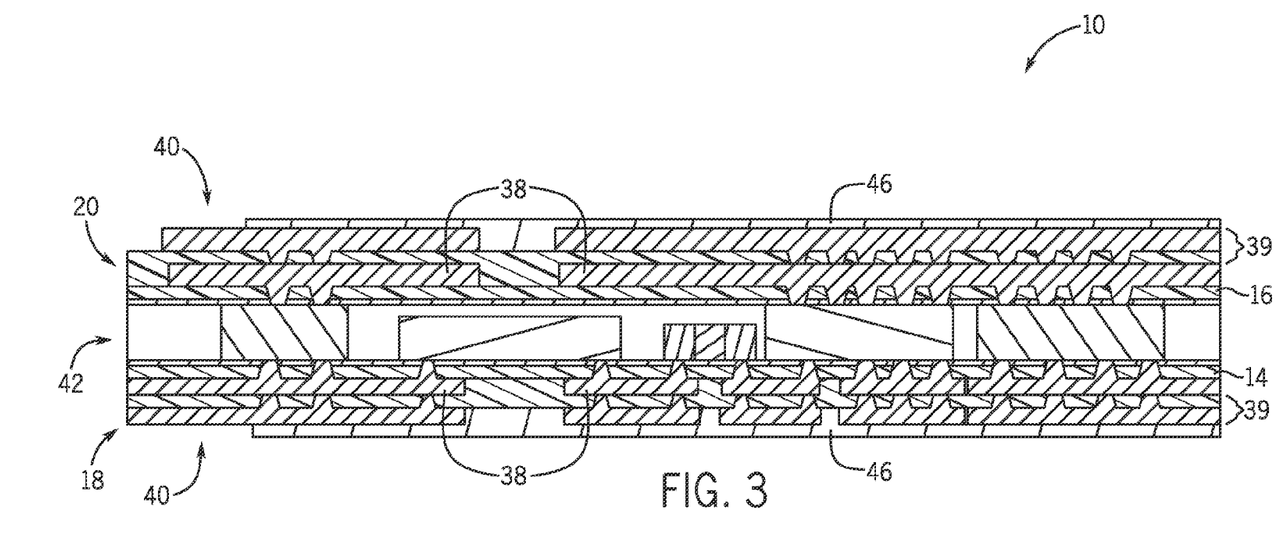
FIG. 3 is a schematic cross-sectional side view of a POL package structure, according to an embodiment of the invention.

Referring now to FIGS. 1-3, according to embodiments of the invention, electrical input/output connections (I/Os) 40 are provided on packaging structure 10 that serve as "electrical leads" that electrically connect the package structure 10 to an external circuit, such as a printed circuit board (PCB)—i.e., the I/O connections 40 are utilized to form a second-level interconnection to an external circuit. The I/O connections 40 may be formed as copper pads or traces of plated copper, for example, that are formed on the front and/or back surfaces 18, 20 of the package structure. The I/O connections establish full electrical functionality at the system-level, such that additional/separate leads, terminals or a lead-frame is not needed in the POL package structure 10, resulting in an ultra-thin, miniaturized electrical package with greatly improved electrical and mechanical performance.

Figure 4A:
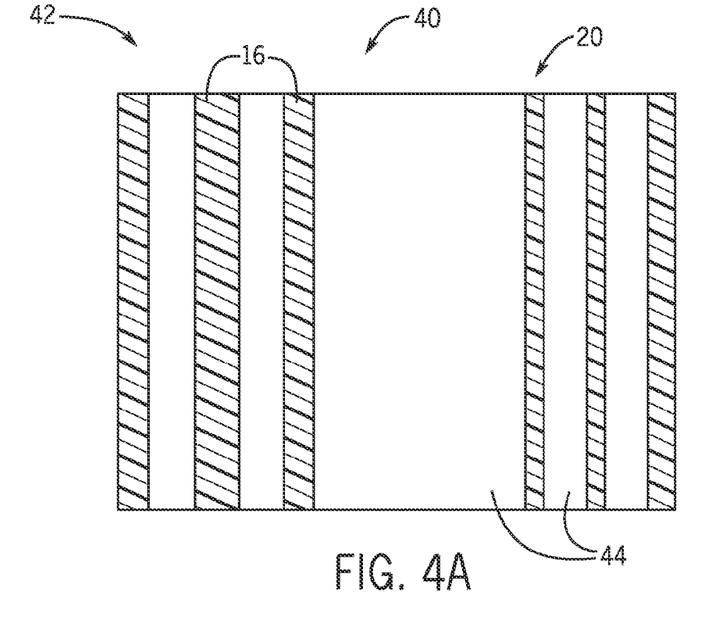
FIGS. 4A and 4B are front and back views of input/output (I/O) connections formed on one end of the POL package structures of FIGS. 1 and 2.
Figure 4B:
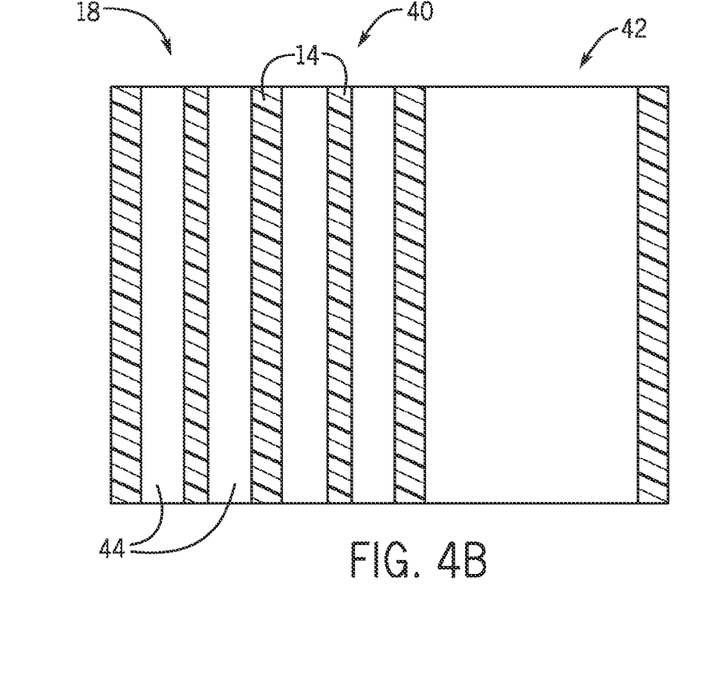

According to an exemplary embodiment of the invention, the I/O connections 40 that provide the second-level interconnection to the PCB are all located on one end 42 of the package structure on one or both of the front and back surfaces 18, 20. Detailed views of the end 42 at which the I/O connections 40 are formed are shown in FIGS. 4A and 4B, which illustrate the front and back surfaces 18, 20 of the package structure 10 at the end 42. As shown in FIGS. 4A and 4B, the copper pads and/or traces of plated copper forming leads 44 (on dielectric layer 14, 16) of the I/O connections 40 are formed at the end 42 of the package structure 10. According to one embodiment, and as best seen in FIGS. 1 and 2, a soldermask 46 may be applied over a remainder of the front and/or back surfaces 18, 20—i.e., over the patterned POL interconnects 38—to provide a protective coating for the copper thereof, while leaving the I/O connections 40 on the end 42 uncovered. Additionally, it is recognized that a solder finish or other metal finish (not shown) may be applied on the exposed areas of patterned POL interconnects 38 (left exposed by the solder mask) or the entire surface of the patterned POL interconnects 38.

Figure 5A:
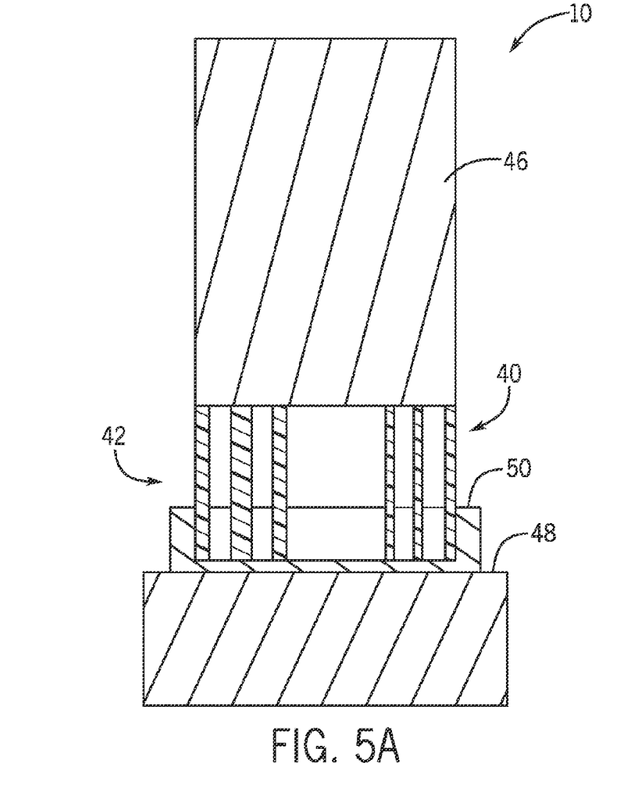
FIGS. 5A and 5B are front and side views of the POL package structures of FIGS. 1 and 2 inserted/embedded into a connector of a printed circuit board (PCB), according to an embodiment of the invention.
Figure 5B:
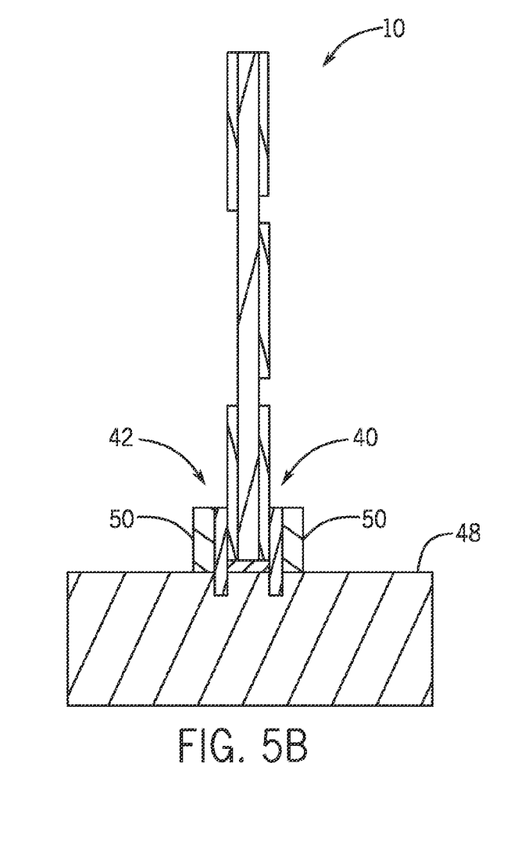
Figure 6:
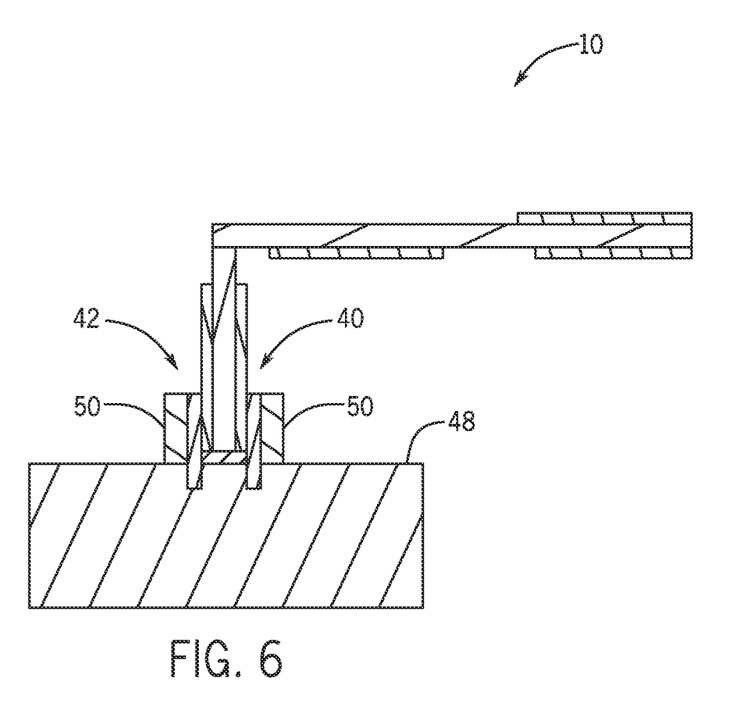
FIG. 6 is a side view of a POL package structure inserted/embedded into a connector of a printed circuit board (PCB), according to an embodiment of the invention.

By providing the I/O connections 40 of the package structure 10 all on end 42, the package structure 10 is constructed to be connected to a PCB on-edge. Such an arrangement of the package structure 10 with a PCB 48 is shown via front and side views in FIGS. 5A and 5B, with the end 42 of the package structure 10 being inserted into a connector or socket 50 on the PCB 48 such that the I/O connections 40 form a direct electrical connection with the connector 50. The mounting of package structure 10 on-edge in an upright orientation (i.e., perpendicular) relative to the PCB 48 minimizes the footprint of the package structure 10 and thus saves board area, although it does serve to increase the height of the PCB assembly. However, according to one embodiment of the invention, the height of the package structure 10 can be reduced by bending the package structure after insertion into socket 50, as shown in FIG. 6. Upon bending, a portion/majority of the package structure 10 is parallel to the PCB 48, with one embodiment being constructed such that the portion of the package structure including the dies/semiconductor devices is parallel to the PCB.

Figure 7:
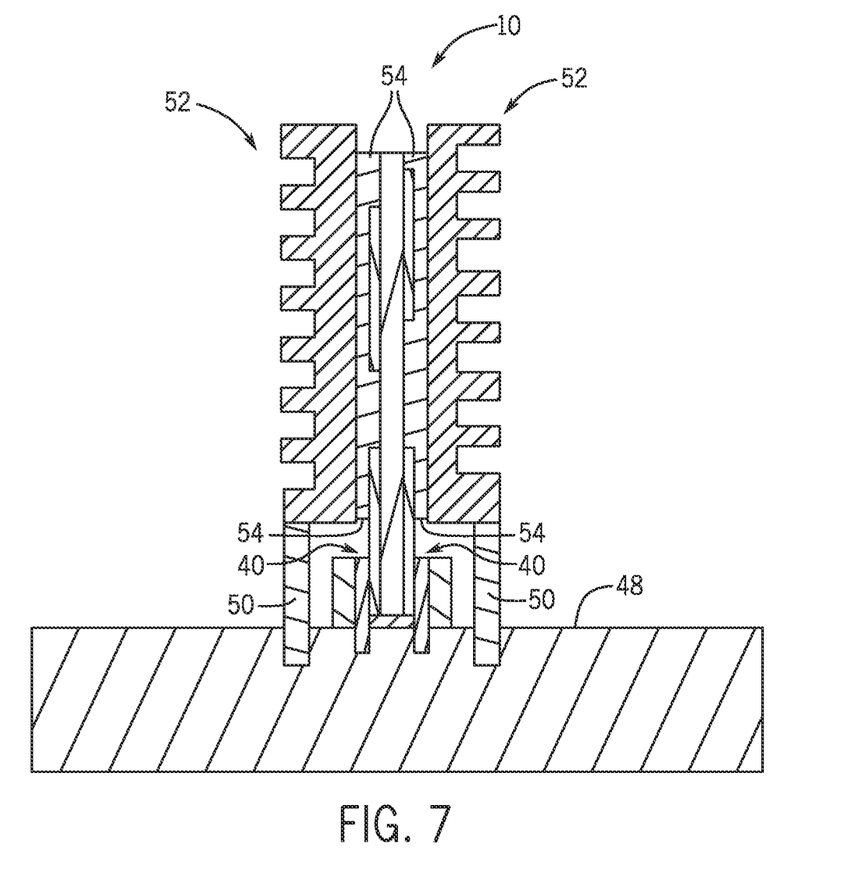
FIG. 7 is a side view of the POL package structures of FIGS. 1 and 2 inserted/embedded into a connector of a printed circuit board, with heat sinks affixed to the package structure and PCB, according to an embodiment of the invention.

Referring now to FIG. 7, according to one embodiment of the invention, one or more heat sinks 52 are coupled to the package structure 10 on the front and/or back surfaces 18, 20 to assist in heat removal and facilitate thermal management of the package structure. While FIG. 7 shows two heat sinks 52 being affixed to package structure 10, it is recognized that only a single heat sink 52 may be attached to the package structure, such as to back side 20 thereof. The heat sinks 52 may be coupled to the package structure 10 such as by adding thermal interface material(s) (TIM) 54 to the backside 20 (and/or front side 18) of the structure. That is, a layer of TIM 54 having a thermal conductivity is applied onto the POL structure 10 and over the POL interconnects 38 (and soldermask 46) to provide bonding and the thermal transfer of energy to the heat sinks 52. Examples of suitable TIMs include, without limitation, adhesives, greases, gels, pads, films, liquid metals, compressible metals, and phase change materials. Liquid metal TIMs, for example, are typically indium-gallium alloys that are in liquid state over temperatures typically encountered in power electronics applications. Compressible metals are sufficiently soft to make intimate contact between a heatsink and POL mating surfaces and may include, for example, indium.

In addition to the heat sinks 52 enhancing heat removal from the package structure 10, the heat sinks 52 also provide mechanical support to the package structure in its on-edge mounting to the PCB 48. That is, in addition to being affixed to package structure 10 (via TIM 54), the heat sinks 52 are also coupled to the PCB 48 such that they provide bracing for the package structure 10. Depending on whether one or two heat sinks 52 are attached to the package structure 10, the heat sinks 52 may thus provide additional structural support to the package structure 10 on either one or both sides thereof to help maintain the package structure 10 in its upright orientation relative to the PCB 48.

Figure 8:
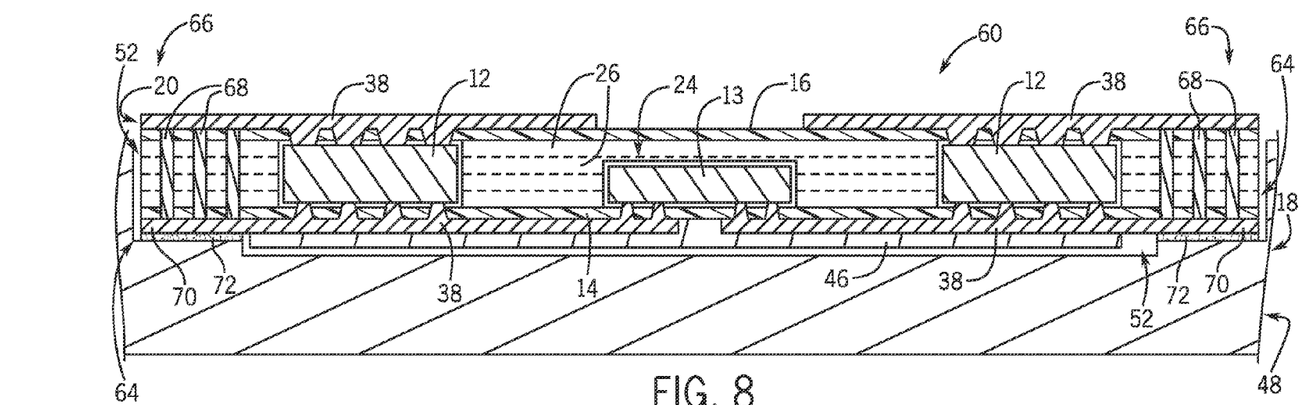
FIG. 8 is a schematic cross-sectional side view of a POL package structure mounted on/embedded in a PCB, according to an embodiment of the invention.
Figure 9:
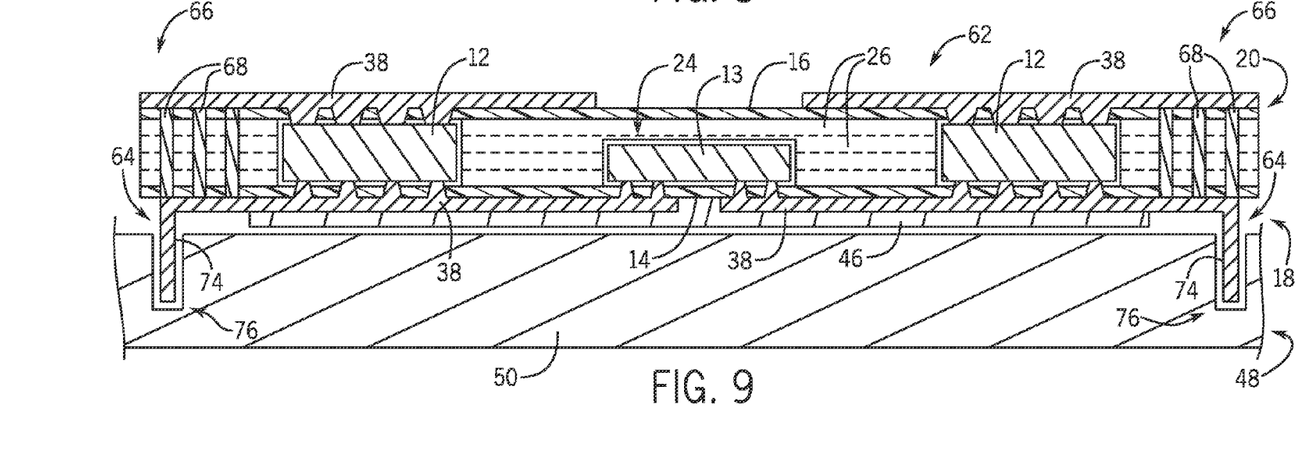
FIG. 9 is a schematic cross-sectional side view of a POL package structure mounted on/embedded in a PCB, according to an embodiment of the invention.

Referring now to FIGS. 8 and 9, package structures 60, 62 are shown according to additional embodiments of the invention, where the package structures are constructed to be partially embedded in an external circuit (e.g., PCB) to which the package structure is mounted, with the package structures having an "ultra-thin" construction in two axes. The package structures 60, 62 shown in FIGS. 8 and 9 have a similar construction to the package structures 10 illustrated in FIGS. 1 and 2 in regards to the embedding of semiconductor devices in an embedding material between dielectric layers and the use of POL interconnects, and thus components in the package structures 60, 62 of FIGS. 8 and 9 identical to corresponding components in the package structure 10 of FIGS. 1 and 2 are similarly numbered.

As shown in FIGS. 8 and 9, each of the package structures 60, 62 is shown as including semiconductor devices 12, 13 positioned between a first dielectric layer 14 and a second dielectric layer 16 (i.e., polyimide layers), with the devices 12, 13 being attached to the polyimide layers 14, 16 by way of an adhesive 22 and being encapsulated by an embedding material that is formed from a one or more dielectric layers 26. The dielectric layer(s) are provided in a 'film' or 'panel' or 'sheet' form that can be stacked on one another to a required height/thickness required to fill in an area about the semiconductor devices 12, 13 and between the polyimide layers 14, 16, with the dielectric sheets 26 being caused to melt and flow when subjected to a lamination/curing process, such that the dielectric sheet(s) 26 thus lose their film form and flow to fill up any empty air gaps around the semiconductor devices 12, 13 and between the polyimide layers 14, 16.

In the package structures 60, 62 a plurality of vias 30 is formed through polyimide layer 14 down to a front surface 32 of the semiconductor devices 12, 13. For power semiconductor devices 12, vias 30 are also formed to back surface 34 of the semiconductor devices 12 to meet electrical and thermal requirements. Metal interconnects 38 are subsequently formed in the package structure 10 to provide electrical and thermal connections/pathways therein, with the interconnects 38 being formed in the vias 30 and out onto the outward facing front and back surfaces 18, 20 of the polyimide layers 14, 16, respectively, such that both front and back surfaces 18, 20 of the package structure 10 include interconnects formed thereon. According to embodiments of the invention, the metal interconnects 38 comprise "POL interconnects" that are formed as robust electroplated copper interconnects that form direct electrical connections in the devices 12, 13. The metal interconnects 38 are patterned and etched to a desired shape, such as to provide for electrical and thermal connections to package structure 10.

Referring to FIG. 8, electrical input/output connections (I/Os) 64 are provided on packaging structure 10 at each of generally opposing ends 66 of the structure that serve as "electrical leads" that electrically connect the package structure 10 to an external circuit 48, such as a printed circuit board (PCB). According to an embodiment, and as shown in FIG. 8, I/O connections 64 are formed on the front surface 18 of the package structure 10. Thru-vias 68 are thus be formed through polyimide layers 14, 16 and dielectric sheet(s) 26 that are metalized (i.e., metal interconnects 38 are formed in/through thru-vias 68) to redistribute electrical connections from the back surface 20 to the front surface 18. While I/O connections 64 are shown as being formed on only the front surface 18 of the package structure 10, it is recognized that the I/O connections 64 could instead be formed on both surfaces of the package—i.e., on front and back surfaces 18, 20—with the thru-vias 68 not being present in such an embodiment.

As shown in FIG. 8, the I/O connections 64 formed on the front surface 18 of the package structure 10 includes leads 70—with the leads 70 being formed as copper pads or traces of plated copper, for example, that are oriented generally parallel to the surface 18 of the package structure and that are utilized to form a second-level interconnection to the PCB 48. A soldermask 46 may be applied over a remainder of the front surface 18—i.e., over the patterned POL interconnects 38—to provide a protective coating for the copper thereof, while leaving the leads 70 of I/O connections 64 on the front surface 18 uncovered. Additionally, it is recognized that a solder finish or other metal finish (not shown) may be applied on the exposed areas of patterned POL interconnects 38 (left exposed by the solder mask) or the entire surface of the patterned POL interconnects 38. As shown in FIG. 8, the package structure 60 is arranged in a "flat" or parallel orientation relative to the PCB 48 and is partially embedded into PCB 48 via positioning of the package structure into a recess 52 of the PCB 48, with solder 72 being applied at the location of the leads 70, so as to establish full electrical functionality at the system-level. In this manner, additional/separate leads, terminals or a lead-frame is not needed in the POL package structure 10, resulting in an ultra-thin, miniaturized electrical package with greatly improved electrical and mechanical performance. As the package structure 60 is partially embedded into PCB 48, a height of the PCB assembly is reduced as compared to an assembly where the package structure is mounted to a generally planar PCB without a recess for receiving a package structure.

Referring now to FIG. 9, the package structure 62 includes I/O connections 64 formed on the front surface 18 of the package structure 10 that includes leads 74 that extend out perpendicularly from front surface 18—so as to provide a connectorized construction for the package structure 62. That is, rather than the leads 74 of the I/O connections 64 on the front surface 18 being structured as flat copper pads/traces as in the embodiment of FIG. 8, the leads 74 of I/O connections 64 are formed as copper wires or traces (alone or include polyimide material, i.e., polyimide 14) that are bent so as to extend perpendicularly outward from front surface 18 of the package structure 62. As shown in FIG. 9, the bent leads 74 of the I/O connections 64 are configured to be inserted/embedded within slots or a socket 76 formed in/on the PCB 48. The leads 74 could then be secured in the slots/socket 76 via sintering, soldering or a mechanical connection (e.g., press-fit), so as to establish full electrical functionality at the system (i.e., a second-level interconnection to the PCB).

Beneficially, embodiments of the invention thus provide a package structure having an "ultra-thin" construction in two axes, with the construction enabling the package structure to be partially embedded in an external circuit (e.g., PCB) to which the package structure is mounted. The use of POL interconnects and I/O connections in the package structure 10 eliminate the need for wire bonds and/or an additional multi-layer substrate (like a DBC substrate, etc.) that would typically be used for electrical and thermal functionality, thereby providing a package with ultra low inductance by providing a small inductance loop and flux cancellation and the elimination of wirebonds and/or larger leads/terminals that can increase inductance. Such elimination of the wire bonds and multi-layer substrate in packaging a power device in the package structure 10 also enables a package structure 10 having a very small form-factor with high device density and a small foot-print, so as to enable system miniaturization to improve electrical and reliability performance of the package. The I/O connections of the package structure allow the package structure to be partially embedded in an external circuit, with embodiments of the invention providing for mounting of the package structure in a connector or recess of the PCB either on-edge/vertical relative to the PCB (so as to reduce a board footprint of the package structure) or flat within a recess of the PCB (to reduce an overall height of the PCB assembly).

Therefore, according to one embodiment of the invention, a package structure includes a first dielectric layer, at least one semiconductor device attached to the first dielectric layer, and an embedding material applied to the first dielectric layer so as to embed the at least one semiconductor device therein, the embedding material comprising one or more additional dielectric layers. The package structure also includes a plurality of vias formed in the first dielectric layer formed to the at least one semiconductor device, metal interconnects formed in the plurality of vias and on one or more outward facing surface of the package structure to form electrical interconnections to the at least one semiconductor device, and input/output (I/O) connections located on one end of the package structure on one or more outward facing surfaces thereof to provide a second level connection to an external circuit. The package structure is configured to interfit with a connector formed on the external circuit to mount the package perpendicular to the external circuit, with the I/O connections on the one end of the package structure being electrically connected to the connector to form the second level connection to the external circuit.

According to another embodiment of the invention, a method of manufacturing a semiconductor device package structure includes attaching at least one semiconductor device to a first dielectric layer by way of an adhesive, applying an embedding material on the first dielectric layer so as to be positioned about the at least one semiconductor device, and performing a lamination process to cause the embedding material to fill any air gaps present around the at least one semiconductor device and so as to embed the at least one semiconductor device therein, wherein the first dielectric layer does not melt or flow during the lamination process. The method also includes forming a plurality of vias to the at least one semiconductor device, forming metallic interconnects in the plurality of vias and over at least a portion of one or more outer surfaces of the package structure to form electrical interconnections to the at least one semiconductor device, and forming input/output (I/O) connections on one or more of the outward facing surfaces of the package structure, at only one end of the package structure, the I/O connections comprising electrical leads that provide a second level connection to an external circuit.

According to yet another embodiment of the invention, a package structure includes a first dielectric layer having an adhesive applied on at least a portion thereof, one or more semiconductor devices attached to the first dielectric layer by way of the adhesive, an embedding material positioned on the first dielectric layer about the one or more semiconductor devices so as to embed the one or more semiconductor devices therein, a plurality of vias formed to the at least one semiconductor device, metal interconnects formed in the plurality of vias to form all electrical and thermal interconnections to the one or more semiconductor devices and in the package structure and input/output (I/O) connections formed on at least one outer surface of the package structure to provide a second level connection to an external circuit, wherein the I/O connections are configured to interfit with a socket or recess formed in the external circuit, such that the package structure is partially embedded in the external circuit when the I/O connections of the package structure are interfit in socket or recess.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A package structure comprising:
   a first dielectric layer;
   at least one semiconductor device adhered directly to the first dielectric layer;
   an embedding material applied to the first dielectric layer so as to embed the at least one semiconductor device therein, the embedding material comprising one or more additional dielectric layers;

a second dielectric layer positioned on an outward facing surface of the package structure opposite the first dielectric layer, with the at least one semiconductor device positioned between the first dielectric layer and the second dielectric layer and the embedding material being fully contained between the first dielectric layer and the second dielectric layer;

a plurality of vias formed to the at least one semiconductor device, the plurality of vias formed through the first dielectric layer;

metal interconnects formed in the plurality of vias and on one or more outward facing surface of the package structure to form electrical interconnections to the at least one semiconductor device;

input/output (I/O) connections located on one end of the package structure on one or more outward facing surfaces thereof to provide a second level connection to an external circuit; and wherein the package structure is configured to interfit with a connector formed on the external circuit to mount the package structure perpendicular to the external circuit, with the I/O connections on the one end of the package structure being electrically connected to the connector to form the second level connection to the external circuit.

2. The package structure of claim 1 wherein the I/O connections comprise electrical leads configured to form the second level connection to the external circuit.

3. The package structure of claim 2 wherein the metal interconnects comprise plated copper power overlay (POL) interconnects forming electrical connections on the one or more outward facing surfaces of the package structure, and wherein a portion of the POL interconnects form the electrical leads that form the I/O connections.

4. The package structure of claim 1 wherein the metal interconnects comprise plated copper power overlay (POL) interconnects forming a heat spreading copper pad on one or more of the outward facing surfaces of the package structure, so as to provide thermal interconnections to the at least one semiconductor device.

5. The package structure of claim 4 further comprising:
a thermal interface material (TIM) applied to the heat spreading copper pad; and
a heat sink mounted to the TIM to conduct heat away from the package structure.

6. The package structure of claim 5 wherein the heat sink is further coupled to the external circuit so as to provide support when mounting the package structure perpendicular to the external circuit.

7. The package structure of claim 1 wherein the I/O connections are formed on both of the outward facing surfaces of the package structure, on the one end of the package structure.

8. The package structure of claim 1 further comprising an adhesive layer applied on an inward facing surface of each of the first and second dielectric layers to secure the at least one semiconductor device thereto, wherein the plurality of vias extend through the adhesive layer.

9. The package structure of claim 8 wherein the at least one semiconductor device comprises a power semiconductor device; and
wherein the plurality of vias comprises:
vias formed through the first dielectric layer and the adhesive layer to a front surface of the power semiconductor device; and
vias formed through the one or more second dielectric layer and the adhesive layer to a back surface of the power semiconductor device;
wherein the vias function as thermal and electrical vias in the package structure; and
wherein metal interconnects are formed in each of the vias to the front and back surfaces of the power semiconductor device.

10. The package structure of claim 8 further comprising a metal layer positioned on an inward facing surface of the first dielectric layer or the second dielectric layer to increase routing in the package structure.

11. The package structure of claim 1 wherein the connector of the external circuit comprises an external circuit socket into which the package structure is inserted to mechanically and electrically couple the I/O connections to the external circuit.

12. The package structure of claim 1 wherein the mounting of the package structure perpendicular to the external circuit reduces a footprint of the package structure on the external circuit as compared to mounting thereof in a flat orientation.

13. The package structure of claim 1 wherein the one or more additional dielectric layers of the embedding material comprise one or more dielectric sheets configured to melt and flow when subjected to a lamination process to fill-in any air gaps present around the at least one semiconductor device.

14. The package structure of claim 13 wherein the embedding material further comprises a metal layer or a dielectric sheet with copper thermally connected to the plurality of vias to spread and conduct heat to an ambient environment, with the metal layer or dielectric sheet with copper constructed to not melt and flow when subjected to the lamination process.

15. The package structure of claim 1 further comprising at least one additional metal circuit layer positioned on the outward facing surfaces of the package structure, the at least one additional metal circuit layer being configured to increase routing in the package structure.

16. The package structure of claim 1 wherein the first and second dielectric layers are formed of a different material than the embedding material, with the first and second dielectric layers being formed of a material that does not melt or flow during a lamination process and the embedding material being formed of a material that melts and flows during the lamination process.

17. A circuit board and package structure arrangement comprising:
a circuit board comprising a connector formed therein; and
a package structure configured to interfit with the connector formed on the circuit board, the package structure comprising:
a first dielectric layer;
at least one semiconductor device attached to the first dielectric layer;
an embedding material applied to the first dielectric layer so as to embed the at least one semiconductor device therein, the embedding material comprising one or more additional dielectric layers;
a second dielectric layer positioned on an outward facing surface of the package structure opposite the first dielectric layer, with the at least one semiconductor device positioned between the first dielectric layer and the second dielectric layer and the embedding material being fully contained between the first dielectric layer and the second dielectric layer;

a plurality of vias formed to the at least one semiconductor device, the plurality of vias formed through the first dielectric layer;

metal interconnects formed in the plurality of vias and on one or more outward facing surface of the package structure to form electrical interconnections to the at least one semiconductor device; and input/output (I/O) connections located on one end of the package structure on one or more outward facing surfaces thereof to provide a second level connection to an external circuit;

wherein the package structure and the connector are constructed such that the package structure interfits with the connector when oriented perpendicular to the circuit board, with the I/O connections on the one end of the package structure being electrically connected to the connector to form the second level connection to the external circuit.

* * * * *